United States Patent
Kashiwazaki

(10) Patent No.: US 9,805,937 B2
(45) Date of Patent: Oct. 31, 2017

(54) METHOD OF MANUFACTURING SEMICONDUCTOR DEVICE AND SEMICONDUCTOR DEVICE

(71) Applicant: Renesas Electronics Corporation, Koutou-ku, Tokyo (JP)

(72) Inventor: Tomoya Kashiwazaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/004,998

(22) Filed: Jan. 24, 2016

(65) Prior Publication Data

US 2016/0254160 A1 Sep. 1, 2016

(30) Foreign Application Priority Data

Feb. 26, 2015 (JP) ................. 2015-036043

(51) Int. Cl.
*H01L 23/544* (2006.01)
*H01L 21/302* (2006.01)
(Continued)

(52) U.S. Cl.
CPC .......... *H01L 21/302* (2013.01); *H01L 21/283* (2013.01); *H01L 21/3043* (2013.01); *H01L 21/6836* (2013.01); *H01L 23/482* (2013.01); *H01L 23/4827* (2013.01); *H01L 23/49513* (2013.01); *H01L 23/49562* (2013.01); *H01L 23/544* (2013.01); *H01L 24/05* (2013.01); *H01L 24/32* (2013.01); *H01L 24/83* (2013.01); *H01L 24/94* (2013.01); *H01L 29/0657* (2013.01);
(Continued)

(58) Field of Classification Search
CPC . H01L 21/302; H01L 21/3043; H01L 21/283; H01L 23/483; H01L 29/1608; H01L 29/41; H01L 29/1657
See application file for complete search history.

(56) References Cited

U.S. PATENT DOCUMENTS 6,372,985 B1 * 4/2002 Shimoe ............... H01L 23/10
174/260
6,759,745 B2 * 7/2004 Masumoto .......... H01L 21/6835
257/730
(Continued)

FOREIGN PATENT DOCUMENTS

JP 10-223572 A 8/1998
JP 2009-188148 A 8/2009

*Primary Examiner* — Jamie C Niesz
(74) *Attorney, Agent, or Firm* — Shapiro, Gabor and Rosenberger, PLLC

(57) ABSTRACT

Reliability of a semiconductor device is improved. A power device includes: a semiconductor chip; a chip mounting part; a solder material electrically coupling a back surface electrode of the semiconductor chip with an upper surface of the chip mounting part; a plurality of inner lead parts and a plurality of outer lead parts electrically coupled with an electrode pad of the semiconductor chip through wires; and a sealing body for sealing the semiconductor chip and the wires. Further, a recess is formed in a peripheral region of the back surface of the semiconductor chip. The recess has a first surface extending to join the back surface and a second surface extending to join the first surface. Also, a metal film is formed over the first surface and the second surface of the recess.

7 Claims, 14 Drawing Sheets

(51) Int. Cl.
  *H01L 23/495* (2006.01)
  *H01L 21/304* (2006.01)
  *H01L 21/283* (2006.01)
  *H01L 29/41* (2006.01)
  *H01L 23/482* (2006.01)
  *H01L 29/06* (2006.01)
  *H01L 21/683* (2006.01)
  *H01L 23/00* (2006.01)
  *H01L 23/31* (2006.01)

(52) U.S. Cl.
  CPC .......... *H01L 29/41* (2013.01); *H01L 23/3107* (2013.01); *H01L 24/03* (2013.01); *H01L 24/29* (2013.01); *H01L 24/45* (2013.01); *H01L 24/48* (2013.01); *H01L 24/49* (2013.01); *H01L 24/85* (2013.01); *H01L 24/92* (2013.01); *H01L 2221/6834* (2013.01); *H01L 2221/68327* (2013.01); *H01L 2223/54433* (2013.01); *H01L 2223/54486* (2013.01); *H01L 2224/03466* (2013.01); *H01L 2224/04026* (2013.01); *H01L 2224/05017* (2013.01); *H01L 2224/05018* (2013.01); *H01L 2224/05082* (2013.01); *H01L 2224/05155* (2013.01); *H01L 2224/05166* (2013.01); *H01L 2224/05557* (2013.01); *H01L 2224/05558* (2013.01); *H01L 2224/05639* (2013.01); *H01L 2224/05644* (2013.01); *H01L 2224/0603* (2013.01); *H01L 2224/291* (2013.01); *H01L 2224/32053* (2013.01); *H01L 2224/32105* (2013.01); *H01L 2224/32106* (2013.01); *H01L 2224/32245* (2013.01); *H01L 2224/45124* (2013.01); *H01L 2224/48091* (2013.01); *H01L 2224/48247* (2013.01); *H01L 2224/48747* (2013.01); *H01L 2224/4903* (2013.01); *H01L 2224/49171* (2013.01); *H01L 2224/73265* (2013.01); *H01L 2224/83365* (2013.01); *H01L 2224/85447* (2013.01); *H01L 2224/92247* (2013.01); *H01L 2224/94* (2013.01); *H01L 2924/10158* (2013.01); *H01L 2924/1306* (2013.01); *H01L 2924/1815* (2013.01)

(56) References Cited

U.S. PATENT DOCUMENTS

| | | | | |
|---|---|---|---|---|
| 7,183,136 | B2* | 2/2007 | Hashimura | B23K 26/18 257/E21.559 |
| 7,528,489 | B2* | 5/2009 | Kajiwara | H01L 23/3107 257/712 |
| 7,646,079 | B2* | 1/2010 | Umemoto | H01L 21/76898 257/621 |
| 7,675,153 | B2* | 3/2010 | Kurosawa | H01L 21/6836 257/686 |
| 7,691,726 | B2* | 4/2010 | Seng | H01L 24/32 257/730 |
| 8,673,695 | B2* | 3/2014 | Okamura | B23K 26/0057 438/149 |
| 2010/0193934 | A1* | 8/2010 | Satou | H01L 23/3107 257/692 |
| 2012/0313224 | A1* | 12/2012 | Fukuda | H01L 21/78 257/622 |
| 2014/0138833 | A1* | 5/2014 | Seng | H01L 29/0657 257/751 |
| 2015/0249133 | A1* | 9/2015 | Yanase | H01L 24/83 257/77 |

* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent of Application No. 2015-036043 filed on Feb. 26, 2015 including the specification, drawings and abstract is incorporated herein by reference in its entirety.

BACKGROUND

The present invention relates to a manufacturing technology of a semiconductor device and the semiconductor device. For example, it relates to a technology effectively applied to the semiconductor device in which semiconductor chips are coupled to a chip mounting part through a bonding material such as a solder material.

In a power system semiconductor device, since it is often the case where a strong electric current is applied to a back surface of a semiconductor chip, a solder material (for example, a solder paste) is used as a bonding material (die bonding material) for bonding the semiconductor chip. That is, the semiconductor chip is mounted over an upper surface of a die pad (chip mounting part) through the solder material.

In assembling the semiconductor device, first, a semiconductor wafer is divided by dicing to obtain a plurality of semiconductor chips. Then, picked out semiconductor chips are mounted over the die pad through the solder material. After that, the semiconductor chips and leads are electrically coupled using metal wires, sealed with a resin, and separated from a lead frame to complete the assembly.

For example, Japanese Unexamined Patent Publication No. Hei 10 (1998)-223572 (Patent Document 1) and Japanese Unexamined Patent Publication No. 2009-188148 (Patent Document 2) disclose a technology in which semiconductor chips are obtained from a semiconductor wafer by dicing it and a semiconductor device is manufactured with use of the semiconductor chips.

[Patent Document 1] Japanese Unexamined Patent Publication No. Hei 10 (1998)-223572

[Patent Document 2] Japanese Unexamined Patent Publication No. 2009-188148

SUMMARY

In a reliability test, such as a temperature cycle test, of the above power system semiconductor device, due to a difference in thermal expansion coefficient between a semiconductor chip and a die pad, a thermal contraction stress is centralized upon a solder material arranged between them, causing a crack in the solder material near a perimeter portion of the chip.

When the crack advances and brings about a state of high impedance, thermal resistance is deteriorated, lowering the reliability of the semiconductor device.

The above and other objects and novel features of the invention will be apparent from the description of the present specification and the accompanying drawings.

A method of manufacturing a semiconductor device according to one embodiment includes the steps of: (a) forming a concave in a first back surface on the side opposite to a first main surface along dicing lines formed over the first main surface of a semiconductor wafer; and (b) forming a metal film over the first back surface of the semiconductor wafer so as to enclose the concave. Furthermore, the method of manufacturing a semiconductor device includes the steps of: (c) dicing the semiconductor wafer along the dicing lines and forming a plurality of semiconductor chips each having a recess in a peripheral region of a second back surface; and (d) mounting the semiconductor chip through a bonding material. In the step (d), the semiconductor chip is mounted through the bonding material such that the recess of the semiconductor chip comes in contact with the bonding material.

Also, the semiconductor device according to one embodiment includes: a semiconductor chip having a main surface, a back surface, a plurality of first electrodes formed over the main surface, and a second electrode formed over the back surface; a chip mounting part having an upper surface and a lower surface; a bonding material electrically coupling the second electrode of the semiconductor chip with the upper surface of the chip mounting part; and a plurality of leads electrically coupled with the first electrodes, respectively. Furthermore, a recess is formed in a peripheral region of the back surface of the semiconductor chip. The recess has: a first surface extending to join the back surface; and a second surface located between the main surface and the back surface in a thickness direction of the semiconductor chip and extending to join the first surface, and a metal film is formed over the first surface and the second surface of the recess.

According to the embodiment described above, the reliability of a semiconductor device can be improved.

DETAILED DESCRIPTION

Figure 1:
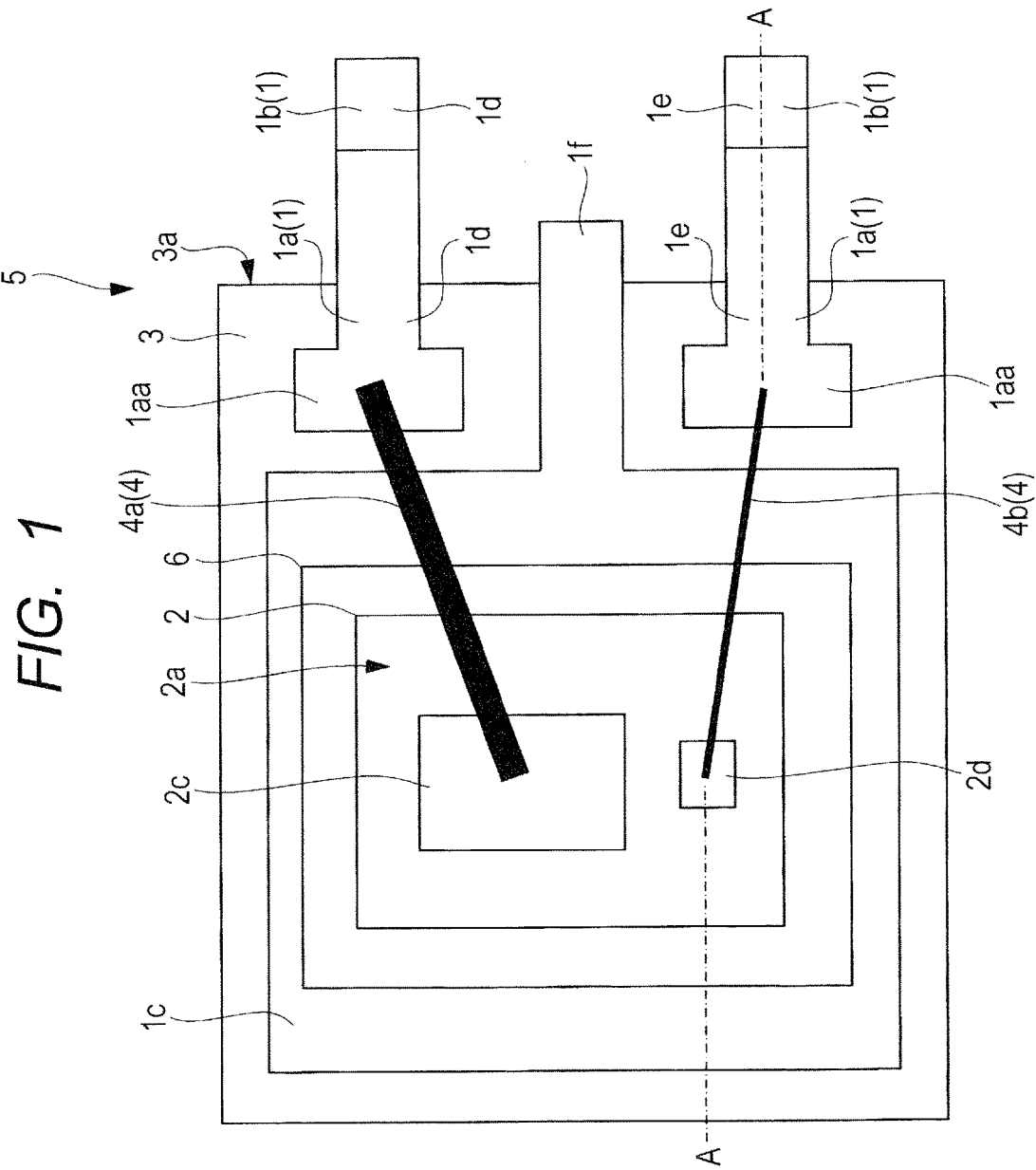
FIG. 1 is a plan view, seen through a sealing body, showing one example of an internal configuration of the semiconductor device of the present embodiment.

In the following embodiment, a description of the same or like parts will not be repeated in principle unless particularly required.

In the following embodiment, a description will be made after divided into a plurality of sections or embodiments if necessary for convenience sake. Except for the case where it shows clearly in particular, they are not mutually unrelated and one has relationships such as a modification, details, and supplementary explanation of some or entire of another.

In the following embodiment, when referring to the number of elements etc. (including the number, a numeric value, an amount, a range, etc.), they may not be restricted to the specific number, except for the case where they are clearly specified in particular and where they are clearly restricted to a specific number theoretically.

Further, in the following embodiment, it is needless to say that an element (including an element step etc.) is not necessarily indispensable, except for the case where it is specified in particular and where is considered to be clearly indispensable from a theoretically point of view, etc.

Likewise, in the description of the embodiment, when the wordings "X comprised of A", "X formed of A", "X including A", and "X containing A" are used as to constituent elements etc., it is needless to say that such wordings do not exclude elements other the element "A", unless otherwise specified. Similarly, in the following embodiment, when shape, positional relationship, etc. of an element etc. are referred to, what resembles or is similar to the shape substantially shall be included, except for the case where it is clearly specified in particular and where it is considered to be clearly not right from a theoretical point of view. This also applies to the numeric value and range described above.

Hereafter, the embodiment of the present invention will be described in detail based on drawings. In all the drawings for describing the embodiment, members of a like function will be identified by like reference characters and numerals in principle and overlapping descriptions will be omitted. In order to make a drawing intelligible, hatching may be attached even if it is a plan view.

Embodiment

Figure 2:
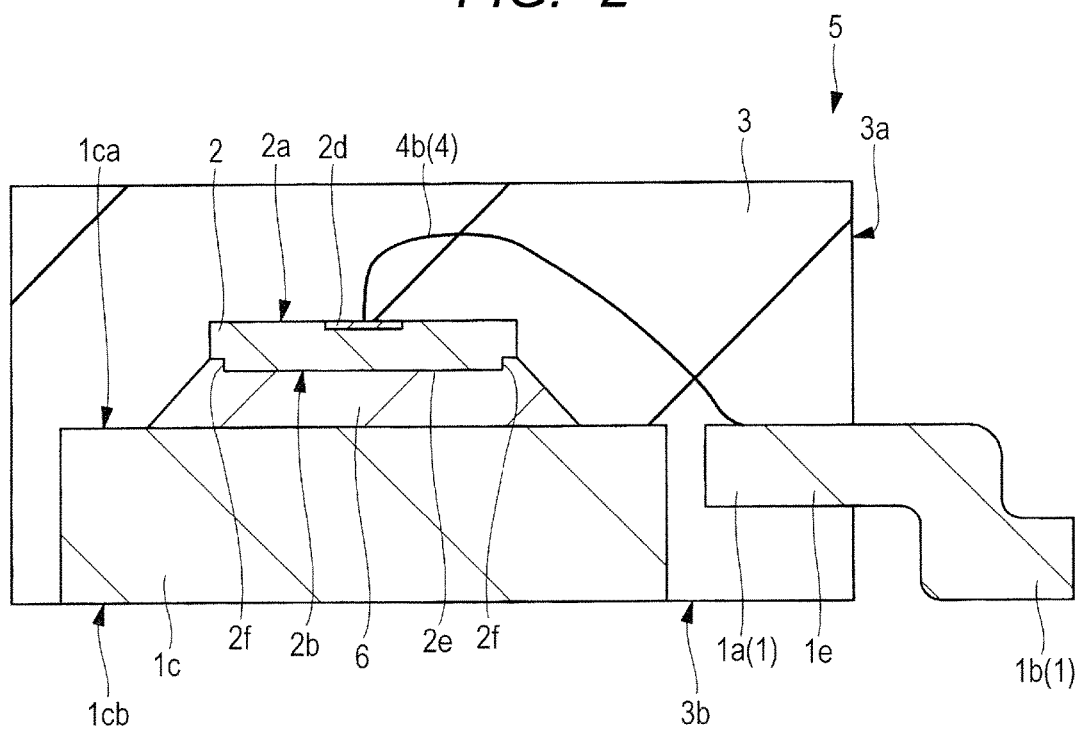
FIG. 2 is a sectional view showing one example of the configuration taken along line A-A of FIG. 1.

FIG. 1 is a plan view, seen through a sealing body, showing one example of an internal configuration of the semiconductor device of the present embodiment; FIG. 2 is a sectional view showing one example of the configuration taken along line A-A of FIG. 1; and FIG. 3 includes a sectional view and a partially enlarged sectional view, showing a configuration of a solder bonding part of FIG. 1. Further, FIG. 4 is a sectional view showing a crack formation state in a solder bonding part of a configuration of a comparative example; and FIG. 5 includes a sectional view and a partially enlarged sectional view, showing a crack formation state in the semiconductor device of FIG. 1.

Figure 3:
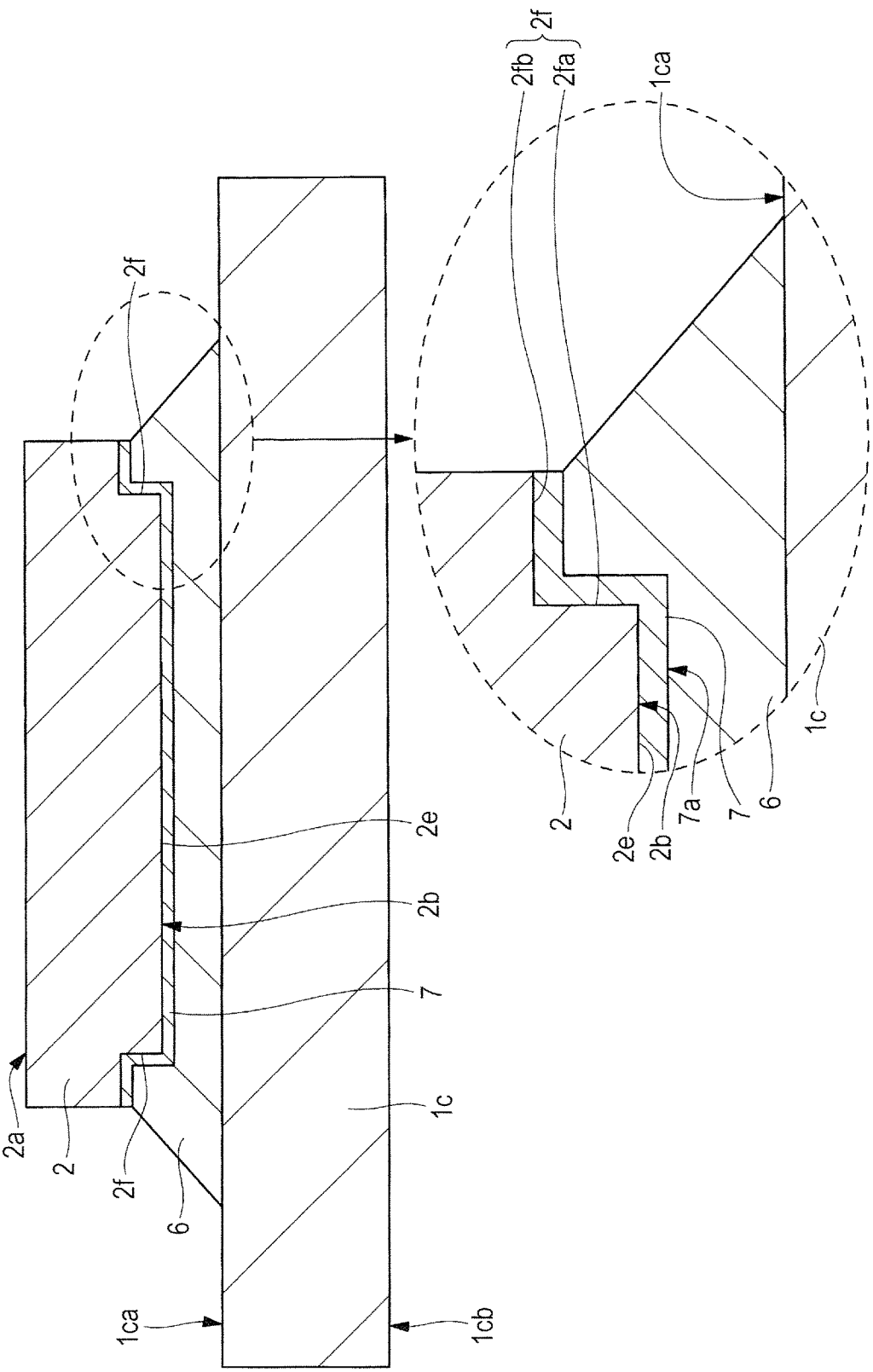
FIG. 3 includes a sectional view and a partially enlarged sectional view, showing a configuration of a solder bonding part of FIG. 1.
Figure 4:
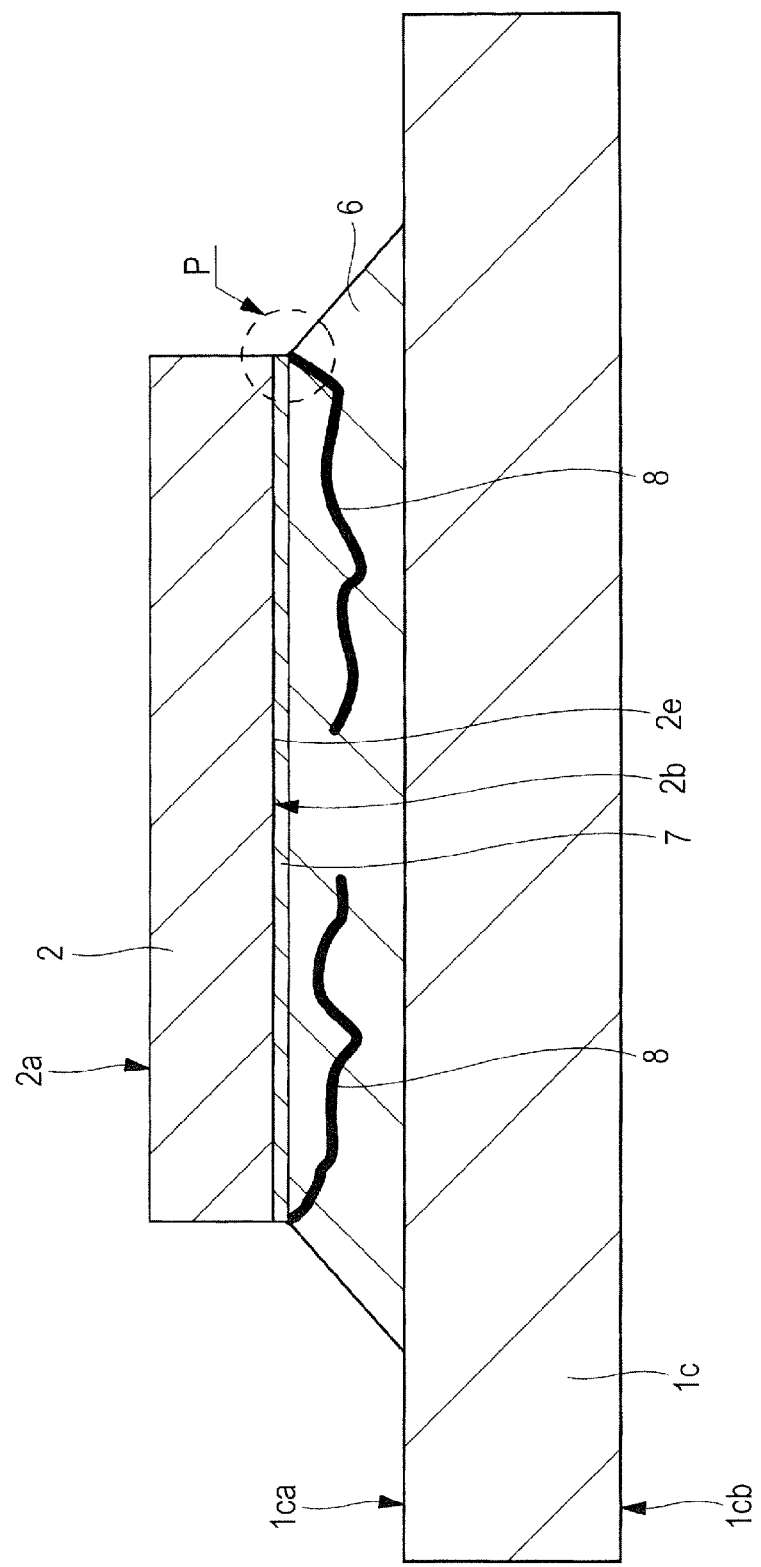
FIG. 4 is a sectional view showing a crack formation state in a solder bonding part of a configuration of a comparative example.

<Semiconductor Device> The semiconductor device of the present embodiment shown in FIGS. 1 to 3 is a semiconductor package which seals a semiconductor chip (also called a "pellet") 2 therein, includes a sealing body 3 containing an insulating resin, and further includes a plurality of leads 1 located inside and outside the sealing body 3. Also, each of the leads 1 has an inner lead part 1a covered with the sealing body 3 and an outer lead part 1b exposed (protruding) outside from the sealing body 3. Each of the outer lead parts 1b (two outer lead parts 1b, in this case) is a terminal for external coupling (external terminal) of the semiconductor device.

As shown in FIG. 1 and FIG. 2, according to the semiconductor device of the present embodiment, the outer lead parts 1b protrude from a given side surface 3a of the sealing body 3. Further, as shown in FIG. 2, there is exposed from the lower surface 3b of the sealing body 3 a lower surface 1cb of a tabular chip mounting part (also called an island, a die pad, a header, or a tab) 1c which supports the semiconductor chip 2 by its upper surface (chip mounting side) 1ca. That is, the semiconductor device of the present embodiment is a surface-mounting type semiconductor device.

Also, each of the outer lead parts 1b of the leads 1 is bent in the shape of a gull wing.

Figure 19:
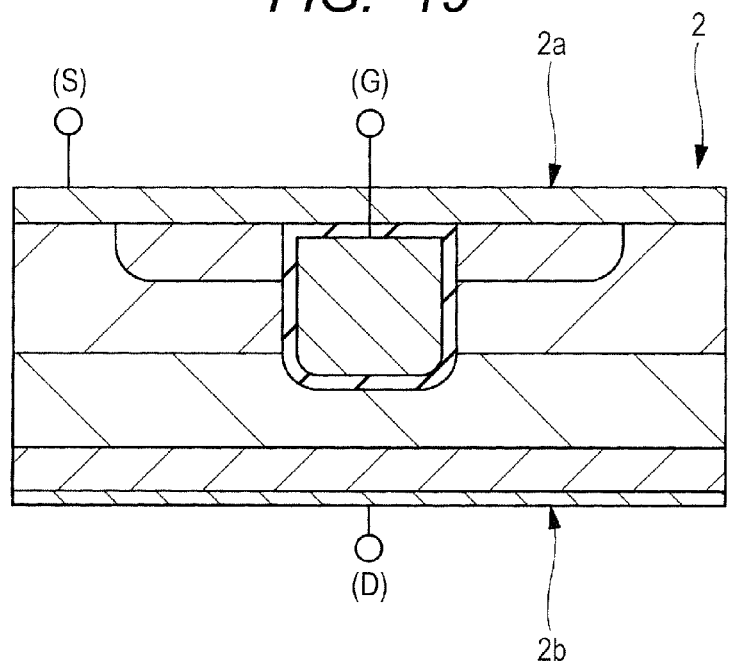
FIG. 19 is a sectional view showing one example of a configuration of a principal part of a semiconductor chip to be mounted over the semiconductor device of the present embodiment.

According to the present embodiment, the power device 5 will be explained as an example of the semiconductor device (power system device) having the configuration described above. For example, in the semiconductor chip 2, a vertical type power MISFET (Metal Insulator Semiconductor Field Effect Transistor) which has a trench gate type configuration as a power transistor is formed. The device configuration of the power MISFET is, as shown in FIG. 19, the one where a trench is formed in its surface and a gate is embedded therein, and includes a drain (D) electrode formed over the back surface 2b of the semiconductor chip 2, a source (S) electrode formed over the main surface 2a, and a gate (G) electrode formed over the main surface 2a, and a strong electric current is applied to the back surface 2b of the semiconductor chip 2. Also, though not shown, a bipolar transistor or an IGBT (Insulated Gate Bipolar Transistor) may serve as a power transistor.

Now, with reference to FIGS. 1 to 3, the detailed configuration of the power device 5 will be explained. The power device 5 includes: a chip mounting part 1c having an upper surface (chip mounting surface) 1ca and a lower surface 1cb on the side opposite to the upper surface 1ca; and a semiconductor chip 2 mounted over the upper surface 1ca of the chip mounting part 1c through a solder material 6 which is a bonding material. The semiconductor chip 2 includes: a main surface (second main surface) 2a; a back surface (second back surface) 2b on the side opposite to the main surface 2a; and a plurality of electrode pads (a first electrode, a bonding electrode, a bonding pad) 2c, 2d formed over the main surface 2a. Further, the semiconductor chip 2 is mounted over the chip mounting part 1c such that the back surface 2b is opposed to the upper surface 1ca of the chip mounting part 1c.

In addition, the back surface 2b of the semiconductor chip 2 is the back surface electrode 2e which is the second electrode, and serves as the drain (D) electrode in the power device 5 of the present embodiment. Therefore, the back surface 2b (back surface electrode 2e) of the semiconductor chip 2 and the chip mounting part 1c need to be coupled electrically and mechanically by a conductive bonding material. Accordingly, in the power device 5, the solder material 6 is used as the conductive bonding material. That is, the back surface 2b (back surface electrode 2e) of the semiconductor chip 2 and the upper surface 1ca of the chip mounting part 1c are adhered and fixed (mechanically coupled) with the solder material 6, and also are electrically coupled.

Further, since the drain electrode (back surface electrode 2e) is formed over the back surface 2b of the semiconductor chip 2, there is produced a lot of heat from the semiconductor chip 2. Therefore, by using the solder material 6 as the bonding material being a die bonding material, the back surface 2b side of the semiconductor chip 2 serves as a route for radiating heat. That is, the heat can be radiated from the back surface 2b side of the semiconductor chip 2 to the chip mounting part 1c through the solder material 6. Therefore, the lower surface 1cb of the chip mounting part 1c is exposed from the lower surface 3b of the sealing body 3.

Further, as shown in FIG. 1, when viewed from the top of the chip mounting part 1c, inner lead parts 1a of the leads 1 (two leads 1, in this case) arranged beside the chip mounting part 1c along one of the sides of the chip mounting part 1c are electrically coupled with the electrode pads (first electrodes) 2c and 2d of the semiconductor chip 2 by conductive wires 4, respectively. Also, a broad part 1aa is formed at the end portion of each inner lead part 1a on the semiconductor chip 2 side, and the wire 4 is coupled to the broad part 1aa.

Further, the first electrodes of the semiconductor chip 2 in the power device 5 of the present embodiment include an electrode pad (source electrode) 2c and an electrode pad (gate electrode) 2d which is smaller than the electrode pad 2c in size as seen in a plan view.

Also, the sealing body 3 shown in FIGS. 1 and 2 has four side surfaces 3a, and two outer lead parts 1b protrude from one of the side surfaces 3a. Further, as shown in FIG. 2, the sealing body 3 seals, therein, apart of the chip mounting part 1c (upper surface 1ca side), the semiconductor chip 2, and the wires 4 such that a lower surface 1cb of the chip mounting part 1c is exposed from a lower surface 3b of the sealing body 3.

Since the semiconductor device of the present embodiment is the power device 5, as shown in FIG. 1, the leads 1 (outer lead parts 1b) protruding from the side surface 3a of the sealing body 3 are the source lead (S) 1d and the gate lead (G) 1e. Also, as shown in FIG. 2, the back surface 2b of the semiconductor chip 2 is, as described above, a drain (D) electrode (back surface electrode 2e). Therefore the lower surface 1cb of the chip mounting part 1c exposed from the lower surface 3b of the sealing body 3 is the drain (D) electrode.

Each of the outer lead parts 1b is integrally formed with the inner lead part 1a. That is, as shown in FIG. 1, the source lead 1d of the outer lead part 1b is integrally coupled with the source lead 1d of the inner lead part 1a. Further, the gate lead 1e of the outer lead part 1b is integrally coupled with the gate lead 1e of the inner lead part 1a.

A wire 4a having a large diameter is electrically coupled to a broad part 1aa of the source lead 1d, and the wire 4a is further electrically coupled to the electrode pad (source electrode) 2c of the first electrodes (bonding electrodes) of the semiconductor chip 2.

That is, since a strong electric current is applied to the source lead 1d of the leads 1, the source lead 1d and the electrode pad (source electrode) 2c of the semiconductor chip 2 are electrically coupled through the wire 4a having the large diameter.

On the other hand, to a broad part 1aa of the gate lead 1e of the inner lead part 1a, a wire 4b whose diameter is smaller than that of the wire 4a is electrically coupled. Further, the wire 4b is electrically coupled to the electrode pad (gate electrode) 2d of the first electrodes (bonding electrodes) of the semiconductor chip 2.

That is, since a weak electric current is applied to the gate lead 1e of the leads 1, the gate lead 1e and the electrode pad 2d of the semiconductor chip 2 are electrically coupled through the thin wire 4b.

Also, as shown in FIG. 1, from the side surface 3a of the sealing body 3, a hanger lead if coupled to the chip mounting part 1c protrudes.

The leads 1 having the chip mounting part 1c, the hanger lead if coupled to the chip mounting part 1c, and the inner lead part 1a as well as the outer lead part 1b include, for example, a Cu alloy mainly containing Cu (copper). Also, according to the present embodiment, the bonding material is, for example, the solder material 6. Further, the wire 4 contains, for example, Al (aluminum) etc. At this time, a diameter of the wire 4a is, for example, 300 to 500 μm and a diameter of the wire 4b is, for example, about 125 μm. Moreover, the sealing body 3 contains, for example, a thermosetting epoxy resin. However, the dimensions and materials of the members are not limited to those described above.

In the power device 5 of the present embodiment, as shown in FIG. 3, a recess 2f is formed in a peripheral region of a back surface 2b of the semiconductor chip 2. That is, the recess 2f is formed along the whole perimeter of an edge portion of the back surface 2b of the semiconductor chip 2. In addition, the recess 2f is a stepped portion, which is dented from the back surface 2b, formed by laser processing.

Moreover, the recess 2f has, as shown in the partially enlarged view in FIG. 3, a first surface 2fa extending to join the back surface 2b and a second surface 2fb located between the main surface 2a and the back surface 2b in a thickness direction of the semiconductor chip 2 and extending to join the first surface 2fa. In addition, the first surface 2fa of the recess 2f is a surface formed along the thickness direction of the semiconductor chip 2, and the second surface 2fb is a surface formed along the main surface 2a or the back surface 2b.

Then, a metal film 7 is formed over the first surface 2fa and the second surface 2fb of the recess 2f. That is, the metal film 7 is formed over the entire back surface 2b of the semiconductor chip 2, and is formed also over the recess 2f which extends to join the back surface 2b.

In this regard, the metal film 7 is for improving wettability with the solder material 6. That is, in the power device 5, the back surface 2b of the semiconductor chip 2 is used as a drain electrode (back surface electrode 2e) and the solder material 6 is used as a radiating route from the back surface 2b. Therefore, it is necessary to improve the connectivity of the solder material 6 and the semiconductor chip 2.

Consequently, it is preferable to arrange a metal material having good wettability with the solder material 6 over the back surface 2b of the semiconductor chip 2. Therefore, according to the present embodiment, the metal film 7 is formed over the back surface 2b including the recess 2f of the semiconductor chip 2. In that case, the metal film 7 has a multilayer configuration. Also, a layer closest to the solder material 6 side in the above multilayer configuration is an Ag layer 7a or an Au layer.

Since the solder material has good wettability with the Ag layer 7a or the Au layer of the metal film 7, the connectivity of the solder material 6 with the back surface 2b of the semiconductor chip 2 can be improved.

In addition, the metal film 7 has a three-layer (multilayer) configuration including Ti, Ni, Ag, etc. from the semiconductor chip side, in this order, or Ti, Ni, Au, etc. from the semiconductor chip side, in this order. The metal film 7 is formed, for example, by processing such as sputtering or vapor deposition.

Now, configurations that the inventors of the present application have compared and examined will be explained with reference to FIG. 4. As a configuration of a comparative example, FIG. 4 shows the one in which a semiconductor chip 2 is mounted over a chip mounting part (metal plate) 1c through a solder material 6. The semiconductor chip 2, the solder material 6, and the chip mounting part 1c are sealed by the sealing body 3 shown in FIG. 2. According to the configuration shown in FIG. 4, the back surface 2b of the semiconductor chip 2 and the solder material 6, the solder material 6 and the chip mounting part 1c, and each of the above members and the sealing body 3 are in contact, respectively. However, the mechanical properties (for example, thermal expansion coefficients) of the members differ greatly.

The thermal expansion coefficients of the above members are, for example, as follows.

Semiconductor chip 2: 3.5 ppm/° C., Chip mounting part 1c: 17.7 $e^{-6}$/° C., Solder material 6: 28.7 ppm/° C., α1 of Sealing body 3: 9 ppm/° C., and α2 of Sealing body 3: 35 ppm/° C. (Glass transition temperature: 135° C.).

In the configuration shown in FIG. 4 using the members having the above thermal expansion coefficients, when there is performed a temperature cycle test in which a cold thermal shock is applied to the semiconductor device such as a power device, the solder material 6 whose thermal expansion coefficient is greater repeats expansion and contraction over the back surface 2b of the semiconductor chip 2.

At this time, as shown in FIG. 4, a crack 8 is formed from a perimeter portion of the semiconductor chip 2 to which a stress is applied into a layer of the solder material 6 and, when the crack 8 advances, a state of high impedance is brought about, deteriorating thermal resistance. As a result, the reliability of the semiconductor device is lowered.

Figure 5:
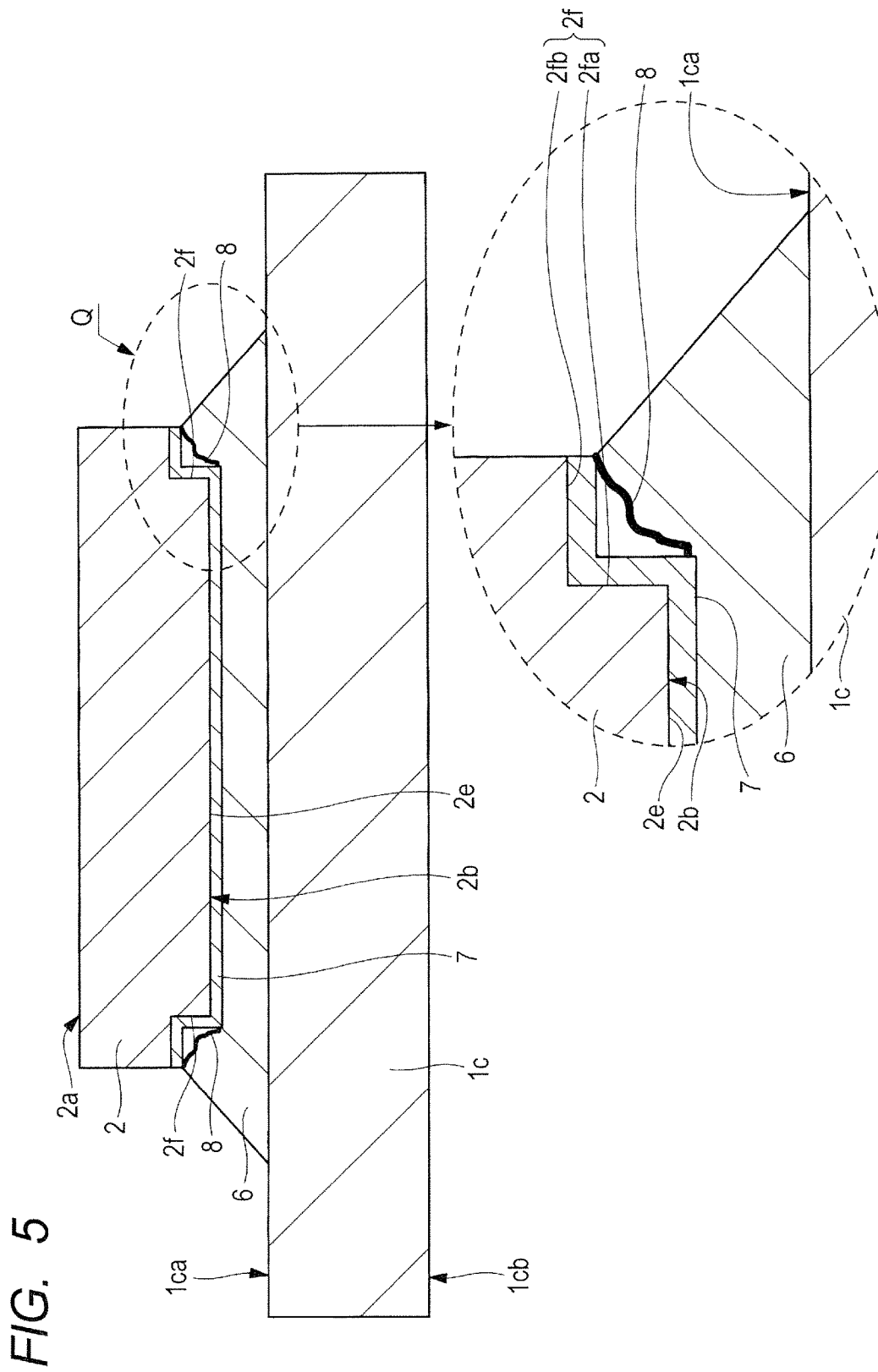
FIG. 5 includes a sectional view and a partially enlarged sectional view, showing a crack formation state in the semiconductor device of FIG. 1.

Therefore, in the power device (semiconductor device) 5 of the present embodiment, as shown in FIG. 3, the recess 2f is formed in the peripheral region of the back surface 2b of the semiconductor chip 2. Consequently, as shown in FIG. 5, it becomes possible to block an advance of the crack 8 formed in the perimeter portion of the back surface 2b of the semiconductor chip 2 by a first surface 2fa of the recess 2f. As a result, the advance of the crack 8 into the layer of the solder material 6 can be stopped.

To put it differently, it becomes possible to reduce a stress in the layer of the solder material 6 by centralizing the crack 8 started from the perimeter portion of the back surface 2b of the semiconductor chip 2 onto the first surface 2fa of the recess 2f in the back surface 2b of the semiconductor chip 2. As a result, reliability of the power device 5 can be improved.

Also, with regard to the configuration of the comparative example shown in FIG. 4 and the configuration of the present embodiment shown in FIG. 5, at the result of examining indexes of stresses given to the layer of the solder material 6 by simulation, when assuming that an index of a stress in a P section of the configuration of the comparative example of FIG. 4 is 1, an index of a stress in a Q section of the configuration where the recess 2f of the present embodiment of FIG. 5 is formed is 0.34. In other words, the following result is obtained. That is, when comparing the stress in the P section of the configuration of the comparative example of FIG. 4 and the stress in the Q section of the configuration in which the recess 2f of the present embodiment of FIG. 5 is formed, the stress given to the solder material 6 of the configuration where the recess 2f is formed is by far smaller.

Thus, by forming the recess 2f in the peripheral region of the back surface 2b of the semiconductor chip 2, the reliability of the power device (semiconductor device) 5 can be improved.

Figure 6:
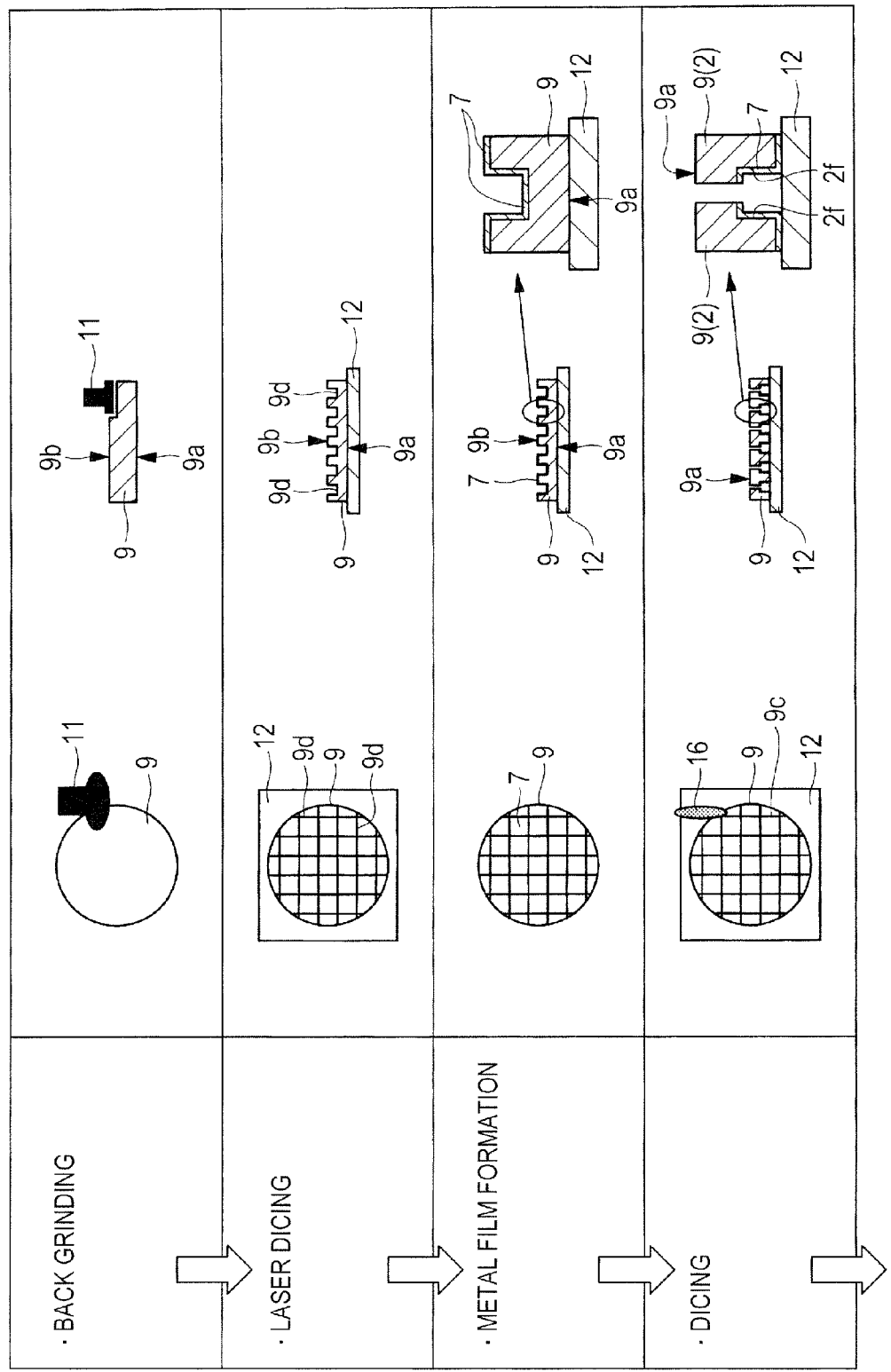
FIG. 6 includes plan views, sectional views, and partially enlarged sectional views, showing one example of an assembly procedure of the semiconductor device of the present embodiment.
Figure 7:
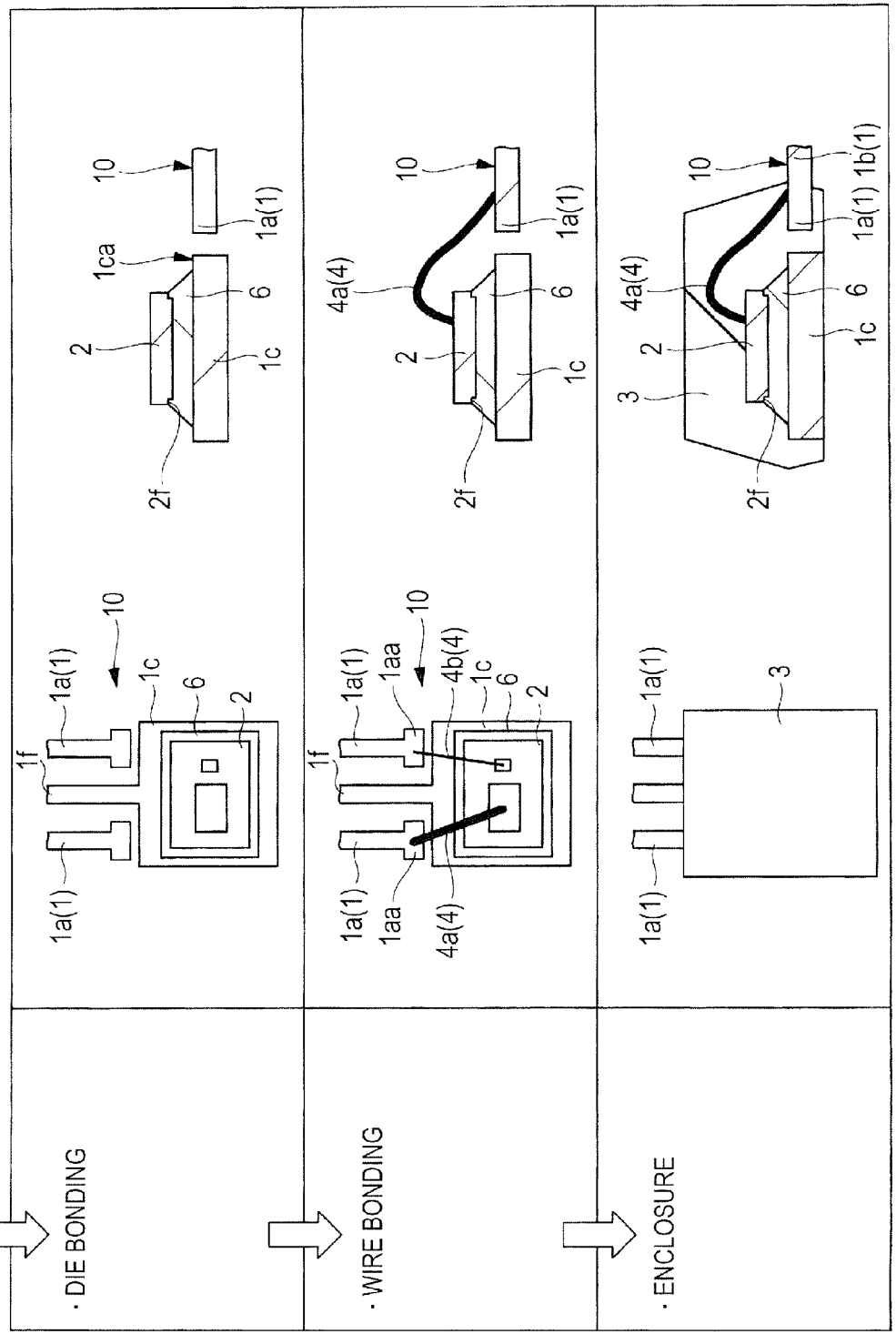
FIG. 7 includes partial plan views and partial sectional views, showing one example of the assembly procedure of the semiconductor device of the present embodiment.
Figure 8:
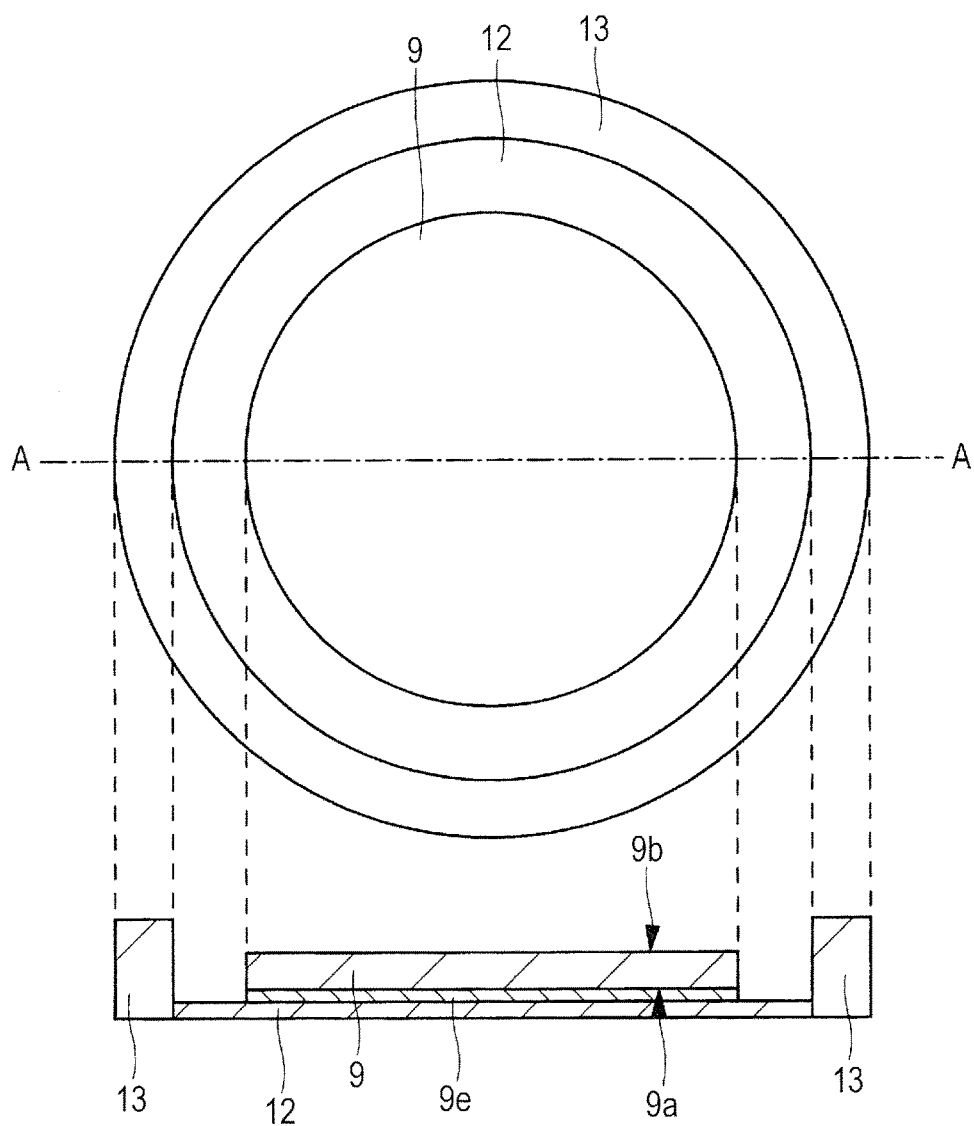
FIG. 8 includes a plan view and a sectional view, showing one example of a wafer supporting state in the laser dicing of the assembly procedure shown in FIG. 6.
Figure 9:
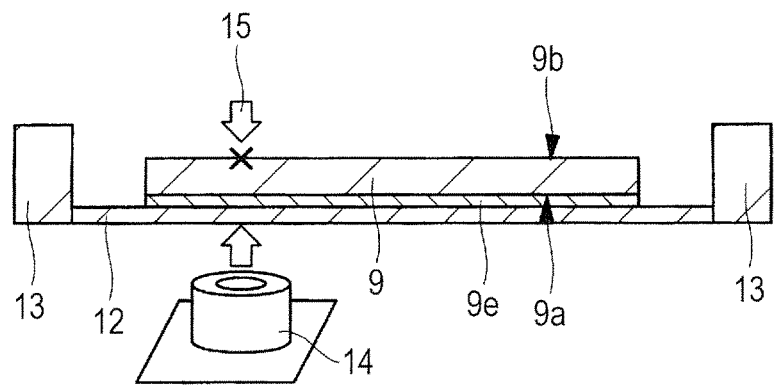
FIG. 9 is a perspective view showing, in a partial cross section, one example of a wafer recognition method in the laser dicing shown in FIG. 8.
Figure 10:
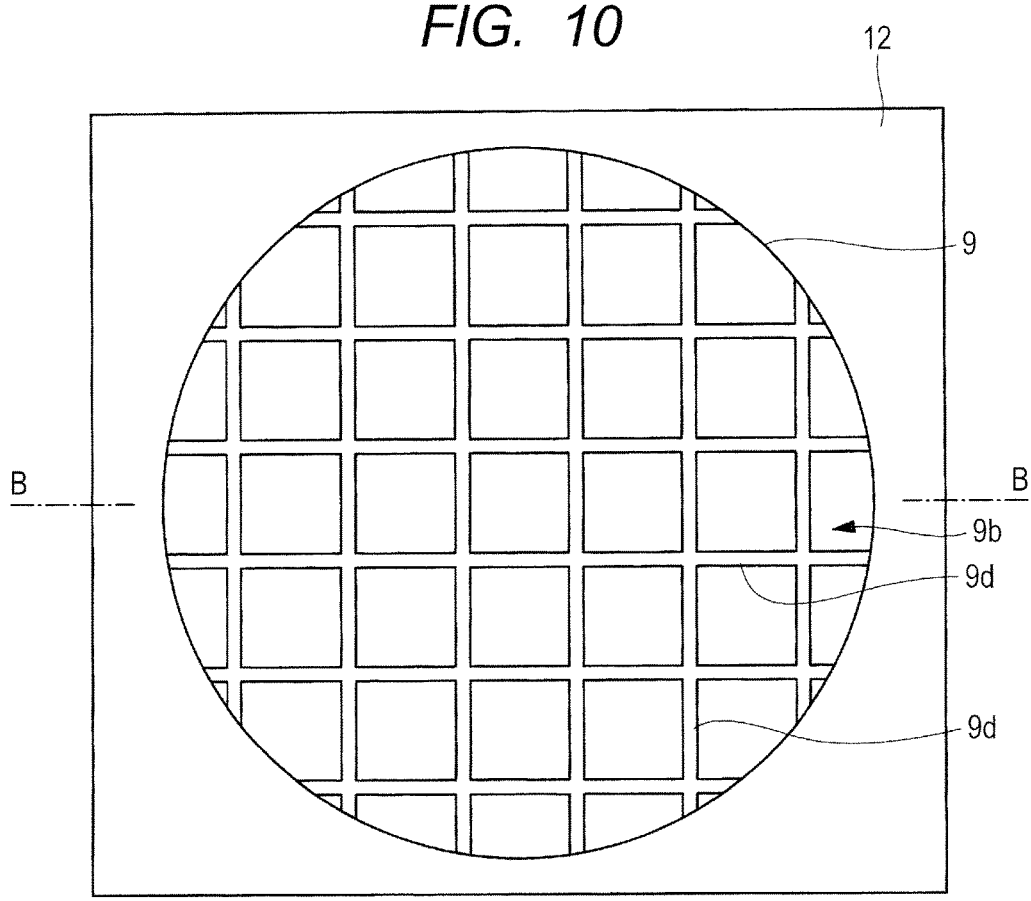
FIG. 10 is a plan view showing one example of the configuration after the laser dicing of the assembly procedure shown in FIG. 6.
Figure 11:
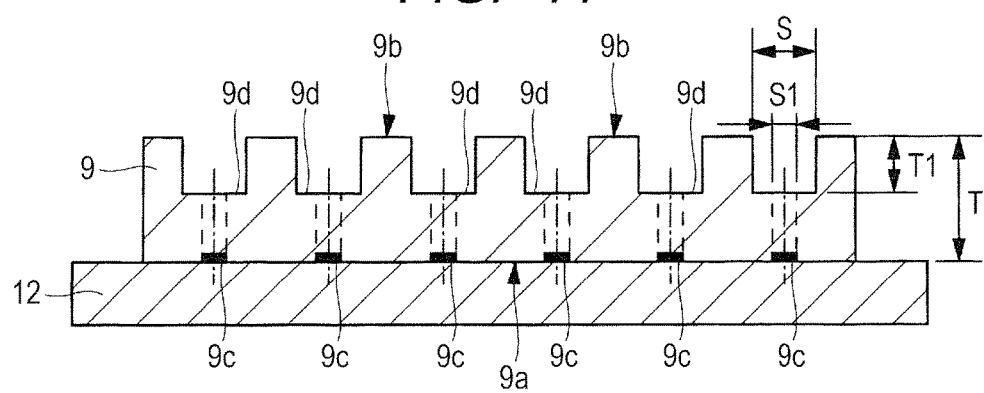
FIG. 11 is a sectional view showing one example of the configuration taken along line B-B of FIG. 10.
Figure 12:
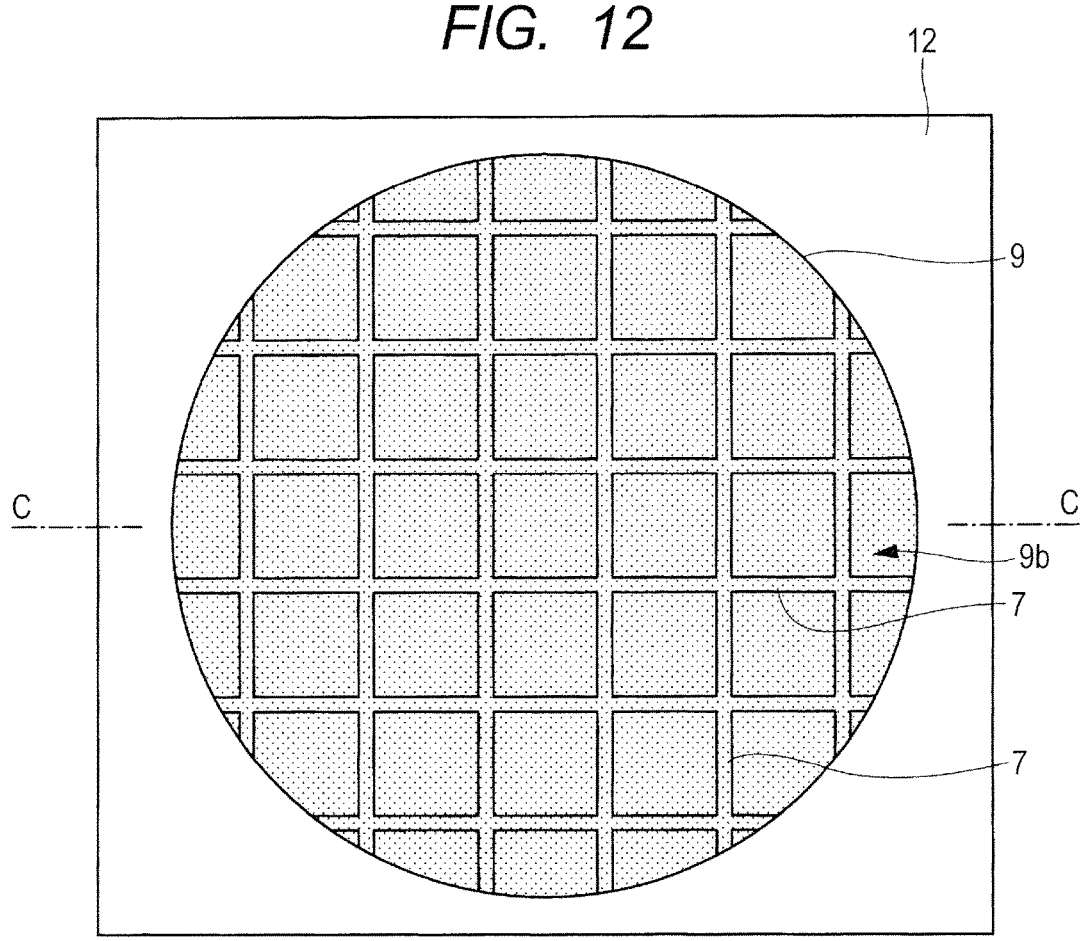
FIG. 12 is a plan view showing one example of the configuration after a metal film formation of the assembly procedure shown in FIG. 6.
Figure 13:
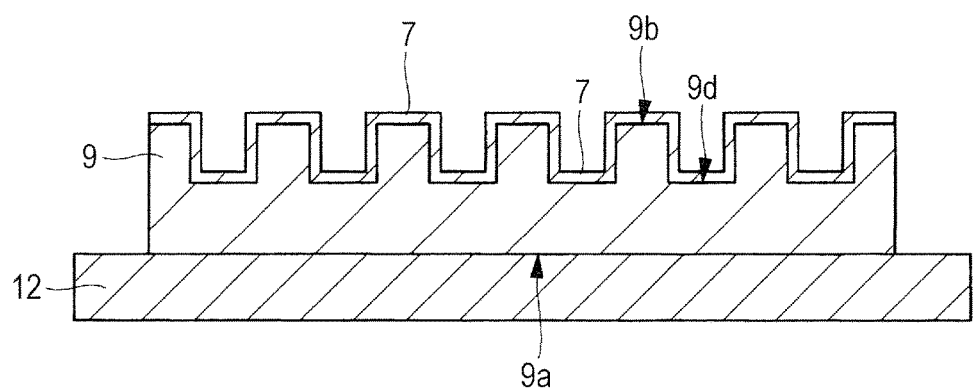
FIG. 13 is a sectional view showing one example of the configuration taken along line C-C of FIG. 12.
Figure 14:
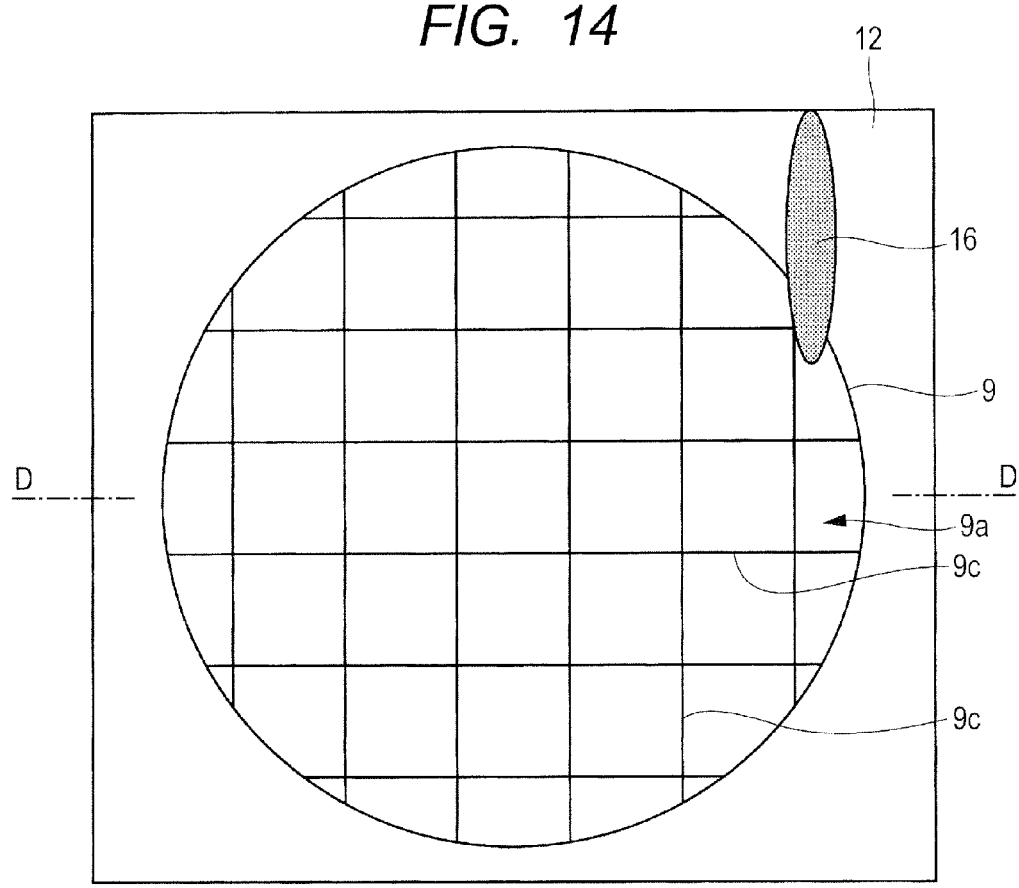
FIG. 14 is a plan view showing one example of the configuration during the dicing of the assembly procedure shown in FIG. 6.
Figure 15:
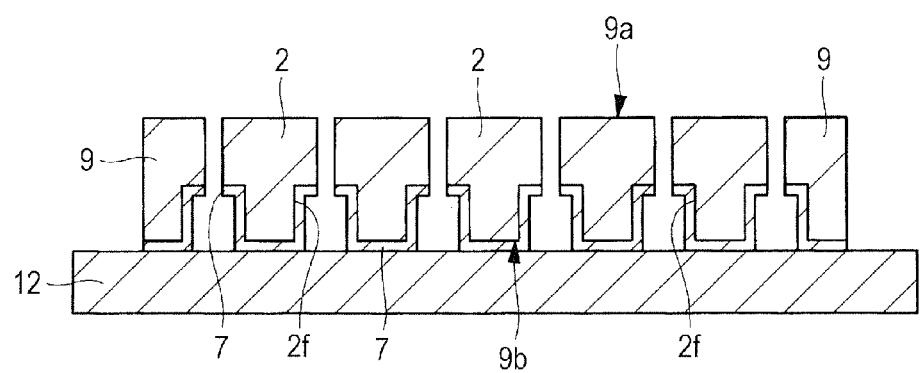
FIG. 15 is a sectional view showing one example of the configuration taken along line D-D of FIG. 14.

<Manufacturing Method of Semiconductor Device> FIG. 6 includes plan views, sectional views, and partially enlarged sectional views, showing one example of an assembly procedure of the semiconductor device of the present embodiment; FIG. 7 includes partial plan views and partial sectional views, showing one example of the assembly procedure of the semiconductor device according to the present embodiment; and FIG. 8 includes a plan view and a sectional view, showing one example of a wafer supporting state in the laser dicing of the assembly procedure shown in FIG. 6. FIG. 9 is a perspective view showing, in a partial cross section, one example of a wafer recognition method in the laser dicing shown in FIG. 8; FIG. 10 is a plan view showing one example of the configuration after the laser dicing of the assembly procedure shown in FIG. 6; FIG. 11 is a sectional view showing one example of the configuration taken along line B-B of FIG. 10; and FIG. 12 is a plan view showing one example of the configuration after a metal film formation of the assembly procedure shown in FIG. 6. Further, FIG. 13 is a sectional view showing one example of the configuration taken along line C-C line of FIG. 12; FIG. 14 is a plan view showing one example of the configuration during the dicing of the assembly procedure shown in FIG. 6; and FIG. 15 is a sectional view showing one example of the configuration taken along line D-D of FIG. 14.

In accordance with the flow shown in FIGS. 6 and 7, a method of manufacturing the power device 5 will be explained.

1. Back Grinding

First, back grinding shown in FIG. 6 is performed to reduce the thickness of the semiconductor wafer 9 to a predetermined thickness by grinding the back surface (first back surface) 9b of the semiconductor wafer 9. In this regard, the thickness of the semiconductor wafer 9 is reduced by grinding the back surface 9b of the semiconductor wafer 9 with a grinding apparatus 11.

Thus, by grinding the back surface of the semiconductor wafer 9 before laser dicing, the semiconductor wafer 9 can be processed efficiently.

That is, the laser processing is not suitable for processing involving a deeper portion because it requires too much time. A process of allowing the semiconductor wafer 9 to have a predetermined thickness (thinning) can be made faster by making the wafer 9 to have the predetermined thickness with use of a grinder in advance and performing laser processing.

2. Laser Dicing

After the back grinding, along dicing lines 9c formed over the main surface (first main surface) 9a of the semiconductor wafer 9, a concave 9d is formed in the back surface 9b on the side opposite to the main surface 9a.

According to the present embodiment, as shown in FIG. 9, the concave 9d shown in FIG. 11 is formed by irradiating a laser 15 to the back surface 9b of the semiconductor wafer 9.

According to the present embodiment, one example of the laser irradiation method is performed as follows. For example, as shown in FIG. 8, the main surface 9a where a pattern 9e of the semiconductor wafer 9 is formed is fastened to a dicing sheet 12 held by a ring 13. Being held by the ring 13 through the dicing sheet 12, as shown in FIG. 9, the main surface 9a of the semiconductor wafer 9 is recognized from a lower side thereof by a camera 14 for pattern recognition.

Thus, the dicing lines 9c of the semiconductor wafer 9 shown in FIG. 11 are recognized and, based on the recognition result, the laser 15 is irradiated to the back surface 9b of the semiconductor wafer 9 along the dicing lines 9c on the main surface 9a side.

When forming the concave 9d in the back surface 9b of the semiconductor wafer 9 as shown in FIG. 10 by irradiating the laser 15, the concave 9d is formed such that a depth of the concave 9d is a half or less than a half of a thickness of the semiconductor wafer 9.

In other words, the concave 9d is formed such that the depth T1 of the concave 9d shown in FIG. 11 formed by irradiating the laser 15 of FIG. 11 becomes a half or less than a half of the thickness T of the semiconductor wafer 9. That is, the concave 9d is formed so as to achieve: T1≤½T.

Thus, by forming the concave 9d so as to achieve T1≤½T, the concave 9d is formed relatively shallowly. Therefore, when the recess 2f (see FIG. 15) is formed in a dicing step to be described later, it becomes possible to suppress an occurrence of chipping off near an edge of the recess 2f.

Further, the concave 9d is formed so that a width S of the concave 9d shown in FIG. 11 may be greater than a width (width S1 of a portion to be cut shown in FIG. 11) of a blade (cutter) 16 shown in FIG. 17 used at the time of dicing in the dicing step to be described later. That is, the concave 9d is formed so that the width S of the concave 9d shown in FIG. 11 may become greater than the width S1 (S>S1) to be cut at the time of dicing in the dicing step.

Thus, when the dicing is performed along the dicing lines 9c in the dicing step, the recess 2f can be formed in a peripheral region of the back surface 2b of the semiconductor chip 2.

3. Metal Film Formation

After the laser dicing, metal film formation shown in FIG. 6 is performed. That is, a metal film 7 is formed over the back surface 9b of the semiconductor wafer 9. In this regard, as shown in FIGS. 12 and 13, the metal film 7 is so formed over the entire back surface 9b of the semiconductor wafer 9 as to enclose a plurality of concaves 9d of the back surface 9b. At that time, the metal film 7 is formed with the main surface 9a of the semiconductor wafer 9 being fixed to the dicing sheet 12.

Also, the metal film 7 is used for achieving good wettability with the solder material 6. Therefore, it is desirable for the metal film 7 to have a multilayer configuration and, at this time, as shown in FIG. 3, a layer most remotely located from the semiconductor wafer 9 in the multilayer configuration is the Ag layer 7a or the Au layer. In other words, the layer which is closest to the solder material 6 in the multilayer configuration is the Ag layer 7a or the Au layer. That is, the Ag layer 7a or the Au layer is used for the layer coupled to the solder material 6 in the multilayer configuration of the metal film 7.

The Ag layer 7a or the Au layer has good wettability with the solder material 6. Therefore, the coupling strength of the semiconductor chip 2 and the solder material 6 can be raised. Further, the occurrence of a poor thermal resistance in the solder material 6 can be suppressed. Moreover, a heat radiating characteristic of the semiconductor chip 2 after the assembly of the power device can be improved.

In addition, the formation of the metal film 7 over the back surface 9b of the semiconductor wafer 9 is performed by processing of sputtering or vapor deposition. In this regard, it is preferable that the metal film 7 has a three-layer (multilayer) configuration of Ti, Ni, Ag, etc. from the semiconductor wafer side in this order, or a three-layer (multilayer) configuration of Ti, Ni, Au, etc. from the semiconductor wafer side in this order.

4. Dicing

After the metal film formation, dicing shown in FIG. 6 is performed. That is, the dicing of the semiconductor wafer 9 is performed along the dicing lines 9c of the main surface 9a, and there is formed a plurality of semiconductor chips 2 each of which has a recess 2f in the peripheral region of the back surface 2b on the side opposite to the main surface 2a (the semiconductor chips 2 of good quality are obtained). In this regard, as shown in FIGS. 14 and 15, with the back surface 9b of the semiconductor wafer 9 being fixed to the dicing sheet 12, a blade 16 is made to run along the dicing lines 9c from the main surface 9a side of the semiconductor wafer 9 to perform the dicing of the semiconductor wafer 9 (divided into the semiconductor chips 2). At this time, a recess 2f is formed in the peripheral region of the back surface 2b of each semiconductor chip 2.

Moreover, as shown in FIG. 19, over the main surface 2a of the semiconductor chip 2, a source (S) electrode and a gate (G) electrode are formed, and also a drain (D) electrode is formed over the back surface 2b.

5. Die Bonding

After the dicing, die bonding shown in FIG. 7 is performed. That is, the semiconductor chip 2 is mounted over the chip mounting part 1c of a lead frame 10 through a bonding material. Also, according to the present embodiment, the solder material 6 is used as the bonding material.

More specifically, the semiconductor chip 2 is mounted over the chip mounting part 1c through the solder material 6 such that the recess 2f formed in the peripheral region of the back surface 2b of the semiconductor chip 2 comes in contact with the solder material 6. That is, with a state in which the recess 2f of the back surface 2b of the semiconductor chip 2 is in contact with the solder material 6, the semiconductor chip 2 is adhered and fixed to the chip mounting part 1c by the solder material 6.

6. Wire Bonding

After the die bonding, wire bonding shown in FIG. 7 is performed. That is, as shown in FIG. 1, electrode pads 2c, 3d of the main surface 2a of the semiconductor chip 2 and inner lead parts 1a corresponding to the electrode pads 2c and 2d, respectively, are electrically coupled with wires 4.

In the wire bonding step, first, wire bonding of the source electrode (electrode pad 2c) shown in FIG. 1 will be performed. That is, the electrode pad 2c which is a source electrode of the semiconductor chip 2 and the source lead 1d (inner lead part 1a) are electrically coupled with the wire 4a having a large diameter. In addition, on the side of the inner lead part, the wire 4a is coupled to the broad part 1aa of the inner lead part 1a.

After completion of the wire bonding of the source electrode, wire bonding of the gate electrode (electrode pad 2d) is performed. That is, with use of a wire 4b whose diameter is smaller than that of the wire 4a, the electrode pad 2*d* which is a gate electrode of the semiconductor chip 2 and the gate lead 1*e* (inner lead part 1*a*) are electrically coupled.

In this regard, as in the case of the source electrode, on the side of the inner lead part, the wire 4*b* is coupled to the broad part 1*aa* of the inner lead part 1*a*. The wires 4*a* and 4*b* are thin metal wires containing, for example, aluminum.

7. Enclosure (Molding)

After the wire bonding, enclosure shown in FIG. 7 is performed. That is, the semiconductor chip 2, the wires 4*a*, the inner lead parts 1*a*, the solder material 6, and the upper surface 1*ca* side of the chip mounting part 1*c* are sealed with a sealing resin to form a sealing body 3.

In the power device 5 according to the present embodiment, the sealing body 3 is formed such that the lower surface 1*cb* of the chip mounting part 1*c* is exposed from the lower surface 3*b* of the sealing body 3. Also, the sealing resin is, for example, a thermosetting epoxy resin.

8. Plating

After the enclosure, plating is performed.

In the plating step, a plating film such as a solder plating is formed over a surface of the outer lead parts 1*b* and a surface of the lower surface 1*cb* of the chip mounting part 1*c* shown in FIG. 2.

9. Marking

After the plating, marking is performed.

In the marking step, for example, a desired mark (impression) is formed over a top surface of the sealing body 3. The above mark is, for example, a product type, a model number, or other information, and is formed by laser irradiation etc.

10. Lead Processing (Division-into-Pieces)

After the marking, lead processing is performed.

In the lead processing step, each outer lead part 1*b* and a hanger lead if shown in FIG. 1 are separated from the lead frame 10 of FIG. 10. Also, as shown in FIG. 2, each outer lead part 1*b* is bent and formed into a predetermined form (for example, a shape of a gull wing, in this case).

Thus, the assembly of the power device 5 is completed.

According to the present embodiment, since the recess (stepped portion) 2*f* is formed in the peripheral region of the back surface 2*b* of the semiconductor chip 2, even if the crack 8 is formed in the solder material 6, the advance of the crack 8 can be stopped by the recess 2*f*.

That is, as shown in the enlarged view of FIG. 5, since the metal film 7 is formed also over the recess 2*f*, the solder material 6 spreads also over the recess 2*f* in a wetting manner. Accordingly, even if the crack 8 is formed, the crack 8 can be brought closer to the recess 2*f*, and the advance of the crack 8 can be prevented by the first surface 2*fa* of the recess 2*f*. That is, the crack 8 formed near the boundary of the solder material 6 and the semiconductor chip 2 advances toward an inner area of the solder material 6. However, according to the present embodiment, the recess 2*f* is formed in the peripheral region of the back surface 2*b* of the semiconductor chip 2. Therefore, the advance of the crack 8 can be prevented by the first surface 2*fa* of the recess 2*f*.

More specifically, an inward advance of the crack 8 formed near the perimeter portion of the solder material 6 can be blocked by the first surface 2*fa* of the recess 2*f*. As a result, the advance of the crack 8 in the layer of the solder material 6 can be stopped.

To put it differently, it becomes possible to reduce the stress in the layer of the solder material 6 by centralizing the crack 8 formed near the perimeter portion of the solder material 6 onto the first surface 2*fa* of the recess 2*f* in the back surface 2*b* of the semiconductor chip 2. As a result, the reliability of the power device (semiconductor device) 5 can be improved.

Particularly, in the power device according to the present embodiment, the back surface 2*b* of the semiconductor chip 2 is used as an electrode (back surface electrode 2*e*). Therefore, the coupling between the solder material 6 and the semiconductor chip 2 is also electrically important. Further, since a relatively strong electric current is applied to the back surface electrode 2*e* (drain electrode), the solder material 6 also serves as part of a radiating route of the heat emitted from the semiconductor chip 2. Therefore, by allowing the coupling state of the solder material 6 and the semiconductor chip 2 to be favorable, the reliability of the power device 5 can be further improved.

Also, the metal film 7 is formed over the back surface 2*b* including the recess 2*f* of the semiconductor chip 2. Since a layer of the metal film 7 closest to the solder material 6 is the Ag layer 7*a* or the Au layer, which has good wettability with the solder material 6, the coupling strength of the semiconductor chip 2 and the solder material 6 can be raised.

As a result, the reliability of the power device 5 can be improved and, thereby, the heat radiating characteristic of the semiconductor chip 2 can be improved. Consequently, as in the case described above, the reliability of the power device 5 can be improved.

Figure 16:
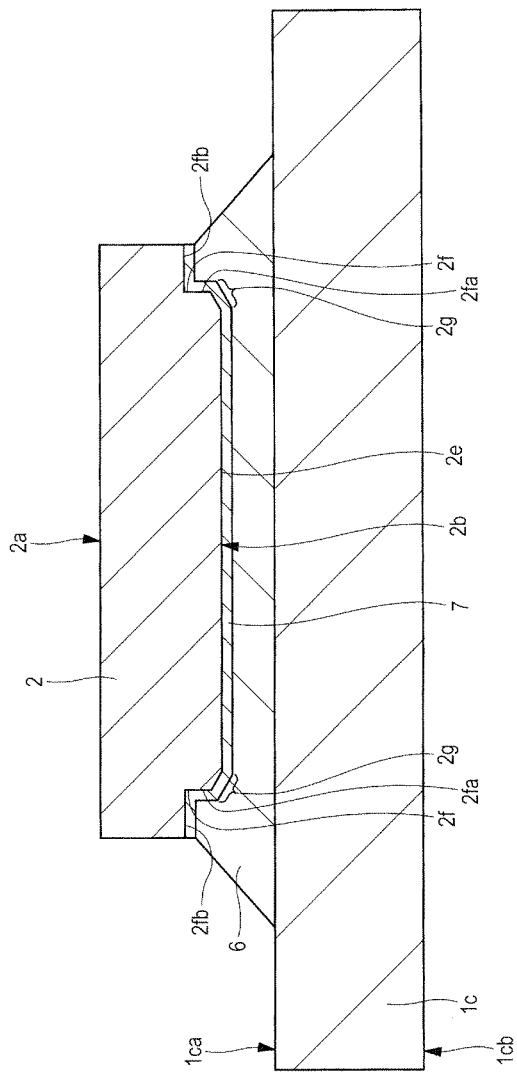
FIG. 16 is a sectional view showing a configuration of a semiconductor chip of Modification 1 of the present embodiment.

<Modification 1> FIG. 16 is a sectional view showing a configuration of a semiconductor chip of Modification 1 of the present embodiment.

In Modification 1 shown in FIG. 16, a taper portion 2*g* is provided to the back surface 2*b* of the semiconductor chip 2. That is, the back surface 2*b* of the semiconductor chip 2 and the first surface 2*fa* of the recess 2*f* extend to join through the taper portion 2*g*.

As shown in FIG. 11, when forming a concave 9*d* in the back surface 9*b* of the semiconductor wafer by laser processing, it is preferred that the taper portion 2 be formed by the laser processing so that the back surface 9*b* and the concave 9*d* may extend to join through the taper portion 2*g*.

Thus, by providing the taper portion 2*g* at which the recess 2*f* and the back surface 2*b* are coupled, the stress applied to the semiconductor chip 2 at the portion for coupling the rear surface 2*b* of the semiconductor chip 2 and the solder material 6 can be dispersed, enhancing the strength of coupling the semiconductor chip 2 and the solder material 6. As a result, the reliability of the power device 5 can be improved.

Figure 17:
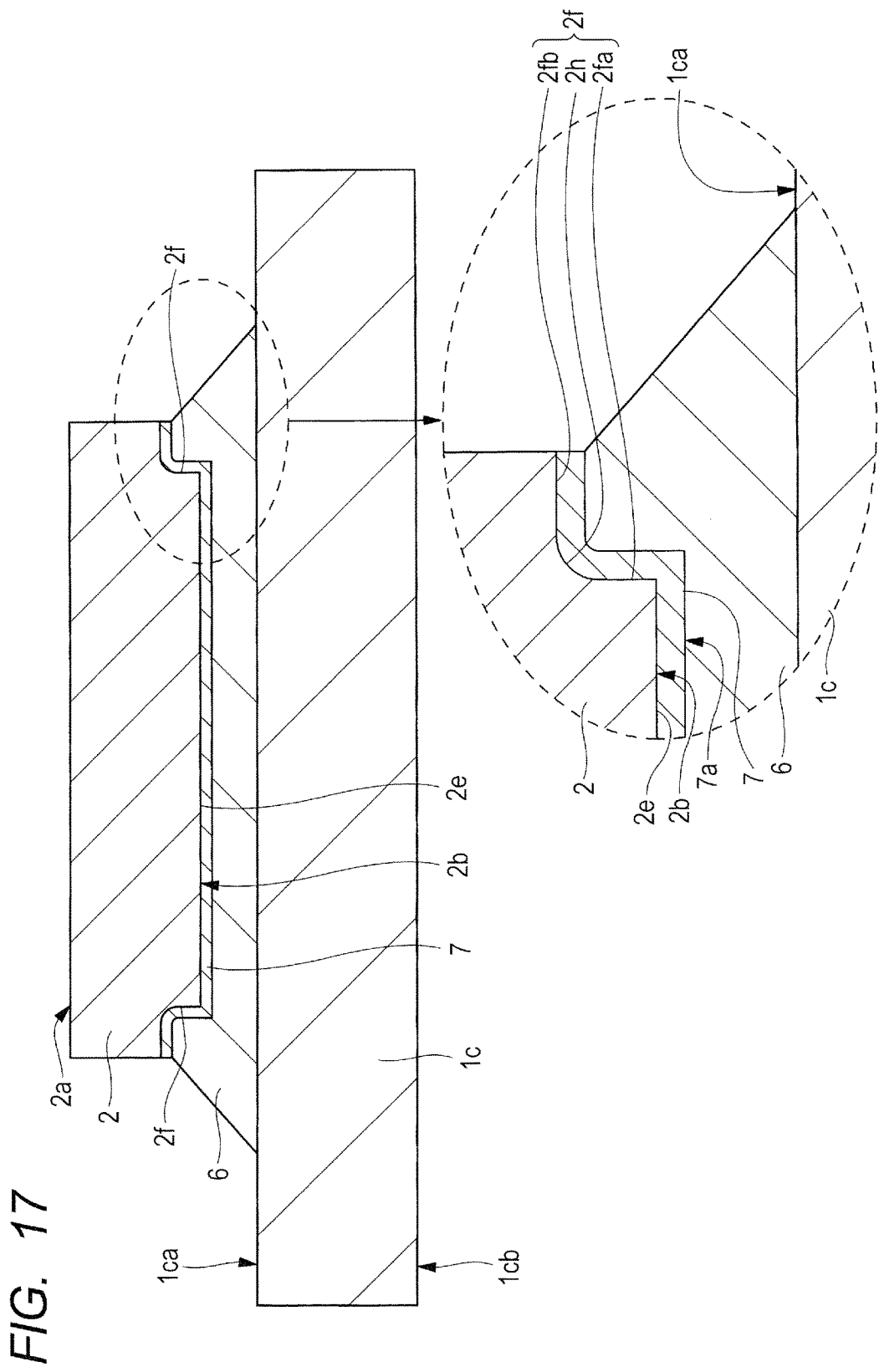
FIG. 17 includes a sectional view and a partially enlarged sectional view, showing a configuration of a semiconductor chip of Modification 2 of to the present embodiment.

<Modification 2> FIG. 17 includes a sectional view and a partially enlarged sectional view, showing a configuration of a semiconductor chip of Modification 2 of the present embodiment.

In Modification 2 shown in FIG. 17, as in the enlarged sectional view thereof, the first surface 2*fa* and the second surface 2*fb* of the recess 2*f* in the back surface 2*b* of the semiconductor chip 2 extend to join through a curved surface portion 2*h*. That is, in the recess 2*f* of the back surface 2*b* of the semiconductor chip 2, a corner portion where the first surface 2*fa* and the second surface 2*fb* crossover is of a curved surface shape.

The curved surface portion 2*h* can be formed also through laser processing by irradiating the laser 15 (see FIG. 9) several times.

Since the first surface 2*fa* and the second surface 2*fb* of the recess 2*f* extend to join through the curved surface portion 2*h*, when forming the metal film 7 in the recess 2*f*, it can be easily formed by adhering it. In this regard, the metal film 7 can be formed over the back surface 9*b* of the semiconductor wafer 9, for example, by processing such as vapor deposition or sputtering.

Further, as for a value of curvature of the curved surface portion 2h, the following value is preferable:

Radius of curvature: R=10 μm or greater

That is, by achieving the above radius of curvature, the metal film 7 can be adhered to the recess 2f of the back surface 9b easily.

<Modification 3> The recess 2f of the back surface 2b of the semiconductor chip 2 may have both the taper part 2g shown in FIG. 16 and the curved surface part 2h shown in FIG. 17 and, in that case, the recess 2f can have both the effects described above.

Figure 18:
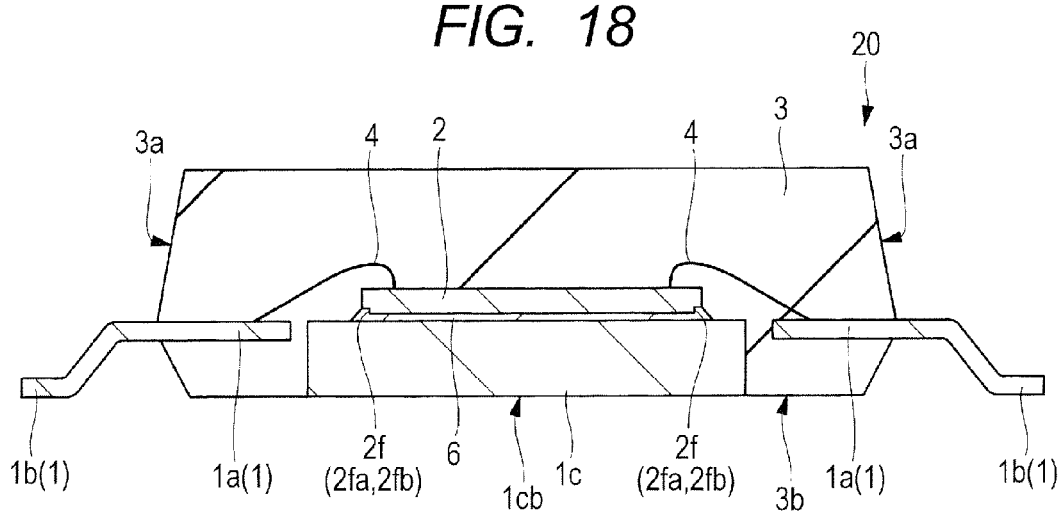
FIG. 18 is a sectional view showing a configuration of a semiconductor device of Modification 4 of the present embodiment.

<Modification 4> FIG. 18 is a sectional view showing a configuration of a semiconductor device of Modification 4 of the present embodiment.

The semiconductor device of Modification 4 shown in FIG. 18 is a power device 20 similar to the power device 5 shown in FIG. 1.

The power device (semiconductor device) 20 is a semiconductor package where the semiconductor chip 2 is mounted over the chip mounting part 1c through the solder material (bonding material) 6. The semiconductor chip 2 is electrically coupled with the inner lead parts 1a through the wires 4. Further, the semiconductor chip 2, the solder material 6, the inner lead parts 1a, and the wires 4 are sealed by the sealing body 3.

Moreover, some of the outer lead parts 1b integrally formed with respective inner lead parts 1a protrude from the side surface 3a opposed to the sealing body 3.

Further, a recess (stepped portion) 2f is formed in the peripheral region of the back surface 2b of the semiconductor chip 2, and the recess 2f is in contact with the solder material 6.

Moreover, similar to the power device 5 of FIG. 1, a strong electric current is applied to the back surface 2b of the semiconductor chip 2 also in the power device 20. Therefore, the solder material 6 serves as part of a radiating route and the lower surface 1cb of the chip mounting part 1c is exposed from the lower surface 3b of the sealing body 3.

In the power device 20 of Modification 4 also, since the recess (the stepped portion) 2f is formed in the peripheral region of the back surface 2b of the semiconductor chip 2, even if the crack 8 is formed in the solder material 6, the advance of the crack 8 can be stopped by the recess 2f.

That is, as in the case of the power device 5 shown in FIG. 1, the inward advance of the crack 8 formed near the perimeter portion of the solder material 6 can be blocked by the first surface 2fa of the recess 2f. As a result, the advance of the crack 8 in the layer of the solder material 6 can be stopped.

Accordingly, the reliability of the power device (semiconductor device) 20 can be improved.

The invention made by the present inventors has been specifically explained above based on the embodiment. It should however be borne in mind that the invention is not limited to or by them but can be modified without departing from the scope of the invention.

For example, in the embodiment described above, the case has been explained where the solder material 6 is used as a bonding material (die bonding material) for coupling the semiconductor chip 2 and the chip mounting part 1c. However, the above bonding material is not limited to the solder material 6. The bonding material may be a material other than the solder material 6 so long as it fixes the semiconductor chip 2 to the chip mounting part 1c, electrically couples the back surface electrode 2e of the semiconductor chip 2 with the chip mounting part 1c, and has a characteristic similar to that of the solder material 6.

In the manufacturing method of the semiconductor device according to the above embodiment, although the case in which the laser dicing is employed has been explained as a method for forming the recess 2f in the back surface 2b of the semiconductor chip 2, blade dicing may be employed instead. However, when considering a level of a shock to be given to the semiconductor chip 2 during dicing, it is preferable to employ the laser dicing.

What is claimed is:

1. A semiconductor device, comprising:
   a semiconductor chip having a main surface, a back surface on the side opposite to the main surface, a plurality of first electrodes formed over the main surface, and a second electrode formed over the back surface;
   a chip mounting part having an upper surface and a lower surface on the side opposite to the upper surface;
   a bonding material electrically coupling the second electrode of the back surface of the semiconductor chip with the upper surface of the chip mounting part;
   a plurality of leads electrically coupled with the first electrodes, respectively, each of the plurality of leads including an inner lead portion and an outer lead portion; and
   a sealing body sealing the semiconductor chip and the chip mounting part,
   wherein a recess is formed in a peripheral region of the back surface of the semiconductor chip,
   wherein the recess has a first surface extending to join the back surface, and a second surface located between the main surface and the back surface in a thickness direction of the semiconductor chip and extending to join the first surface, the first surface being perpendicular to the back surface,
   wherein the back surface and the first surface of the semiconductor chip extend so as to connect through a taper surface portion,
   wherein a metal film is formed over the first surface and the second surface of the recess,
   wherein the sealing body covers the inner lead portions of the plurality of leads,
   wherein the outer lead portions of the plurality of leads are exposed from a first surface of the sealing body, and
   wherein the lower surface of the chip mounting part is exposed from a second surface of the sealing body.

2. The semiconductor device according to claim 1, wherein the bonding material is a solder material.

3. The semiconductor device according to claim 1, wherein the metal film has a multilayer configuration and a layer closest to the bonding material side in the multilayer configuration is an Ag layer or an Au layer.

4. The semiconductor device according to claim 1, wherein the first surface and the second surface of the recess of the semiconductor chip extend to join through a curved surface portion.

5. The semiconductor device according to claim 1, wherein the recess is a stepped portion formed by laser processing.

6. The semiconductor device according to claim 4, wherein a radius of curvature of the curved surface portion is at least 10 μm.

7. A semiconductor device, comprising:
   a semiconductor chip having a main surface, a back surface on the side opposite to the main surface, a plurality of first electrodes formed over the main surface, and a second electrode formed over the back surface;

a chip mounting part having an upper surface and a lower surface on the side opposite to the upper surface; and a bonding material electrically coupling the second electrode of the back surface of the semiconductor chip with the upper surface of the chip mounting part, wherein a recess is formed in a peripheral region of the back surface of the semiconductor chip, wherein the recess has a first surface extending to join the back surface, and a second surface located between the main surface and the back surface in a thickness direction of the semiconductor chip and extending to join the first surface, the first surface being perpendicular to the back surface, wherein the back surface and the first surface of the semiconductor chip extend so as to connect through a taper surface portion, and wherein a metal film is formed over the first surface and the second surface of the recess.

\* \* \* \* \*